(12) United States Patent
Nakabayashi et al.

(10) Patent No.: US 12,379,653 B2
(45) Date of Patent: Aug. 5, 2025

(54) PATTERN FORMATION METHOD AND PHOTOSENSITIVE HARD MASK

(71) Applicant: Tokyo Electron Limited, Tokyo (JP)

(72) Inventors: Hajime Nakabayashi, Nirasaki (JP);
Tomohito Yamaji, Nirasaki (JP);
Kazuki Yamada, Nirasaki (JP);
Ryuichi Asako, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 365 days.

(21) Appl. No.: 17/861,566

(22) Filed: Jul. 11, 2022

(65) Prior Publication Data

US 2023/0019943 A1    Jan. 19, 2023

(30) Foreign Application Priority Data

Jul. 13, 2021  (JP) ................. 2021-115453

(51) Int. Cl.
*G03F 1/22* (2012.01)
*H01L 21/033* (2006.01)

(52) U.S. Cl.
CPC ............ *G03F 1/22* (2013.01); *H01L 21/0332* (2013.01); *H01L 21/0337* (2013.01)

(58) Field of Classification Search
CPC .......... G03F 1/22; G03F 7/0043; G03F 7/094; G03F 7/0042; G03F 7/11; H01L 21/0332; H01L 21/0337; H01L 21/31144; H01L 21/32139

USPC ......................................................... 438/694
See application file for complete search history.

(56) References Cited

U.S. PATENT DOCUMENTS

| | | | |
|---|---|---|---|
| 2009/0153826 A1* | 6/2009 | Sewell | G03F 7/70466 355/77 |
| 2013/0295507 A1 | 11/2013 | Keszler et al. | |
| 2020/0089104 A1* | 3/2020 | Marks | G03F 7/0043 |
| 2022/0002882 A1* | 1/2022 | Kalutarage | G03F 7/265 |

FOREIGN PATENT DOCUMENTS

| | | |
|---|---|---|
| JP | 2008046513 A | 2/2008 |
| JP | 2009-147334 A | 7/2009 |
| JP | 2020-101593 A | 7/2020 |
| KR | 1020160045036 A | 4/2016 |
| KR | 1020160088209 A | 7/2016 |
| KR | 1020180108864 A | 10/2018 |

* cited by examiner

*Primary Examiner* — Duy Vu N Deo
(74) *Attorney, Agent, or Firm* — Nath, Goldberg & Meyer; Jerald L. Meyer; Tanya E. Harkins

(57) ABSTRACT

A pattern formation method includes: forming a photosensitive hard mask made of a transition metal oxide film on a surface of a substrate; exposing the photosensitive hard mask to EUV light in a desired pattern; causing a state change in an exposed region by heat generated during exposure; and selectively removing either a region where the state change has occurred or a region where the state change has not occurred.

18 Claims, 11 Drawing Sheets

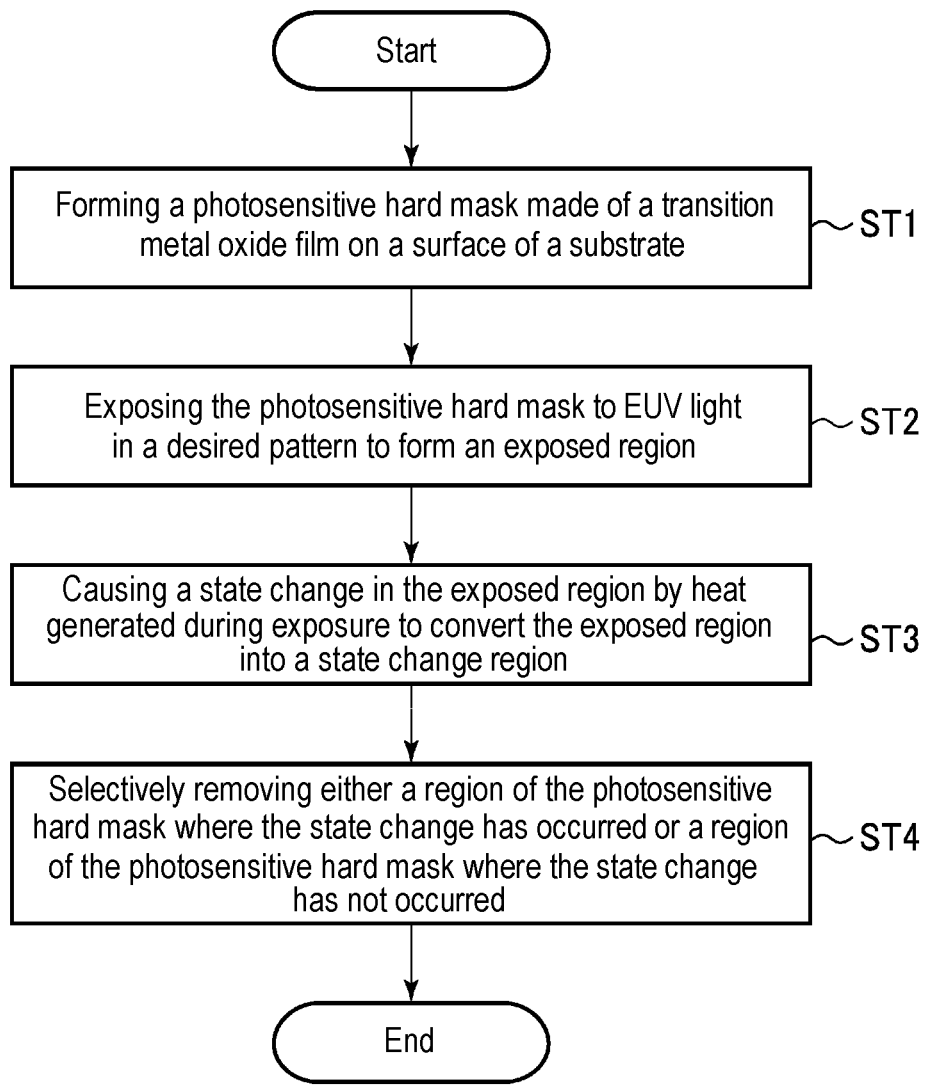

PATTERN FORMATION METHOD AND PHOTOSENSITIVE HARD MASK

CROSS-REFERENCE TO RELATED APPLICATION

This application is based upon and claims the benefit of priority from Japanese Patent Application No. 2021-115453, filed on Jul. 13, 2021, the entire contents of which are incorporated herein by reference.

TECHNICAL FIELD

The present disclosure relates to a pattern formation method and a photosensitive hard mask.

BACKGROUND

As the next-generation exposure technique for coping with the miniaturization of semiconductor devices, there has been studied a technique that makes use of EUV (extreme ultraviolet) having a very short wavelength of 13.5 nm. In the pattern formation using an EUV exposure apparatus, a chemically amplified resist is used as a photosensitive material. In addition, various proposals have been made to increase the sensitivity of the chemically amplified resist to EUV and shorten the exposure time (for example, Patent Document 1).

PRIOR ART DOCUMENT

Patent Document

Patent Document 1: Japanese Laid-Open Patent Publication No. 2020-101593

SUMMARY

According to one embodiment of the present disclosure, there is provided a pattern formation method, including: forming a photosensitive hard mask made of a transition metal oxide film on a surface of a substrate; exposing the photosensitive hard mask to EUV light in a desired pattern; causing a state change in an exposed region by heat generated during exposure; and selectively removing either a region where the state change has occurred or a region where the state change has not occurred.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a probe chart for explaining a pattern formation method of forming a pattern on a photosensitive hard mask.

DETAILED DESCRIPTION

Hereinafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Pattern Formation Method for Photosensitive Hard Mask>

First, a method of forming a pattern by performing EUV exposure and development on a photosensitive hard mask will be described. FIG. 1 is a flowchart for explaining a pattern formation method of forming a pattern on a photosensitive hard mask. FIGS. 2A to 2D are process sectional views showing the pattern formation method.

Figure 2A:
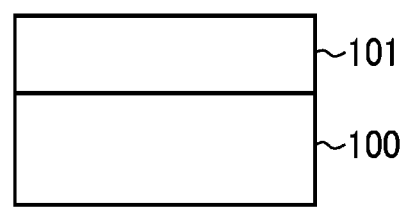
FIGS. 2A to 2D are process sectional views showing the pattern formation method of forming a pattern on a photosensitive hard mask.

First, a photosensitive hard mask 101 made of a transition metal oxide film is formed on the surface of a substrate 100 (step ST1 in FIG. 2A).

Examples of a transition metal oxide include tetravalent transition metal oxides such as $HfO_2$ and $ZrO_2$, and low-melting-point polyvalent oxides such as $WO_x$, $MoO_x$ and $VO_x$. The photosensitive hard mask 101 may be formed by a thin film formation technique, for example, physical vapor deposition (PVD) such as sputtering or the like, chemical vapor deposition (CVD), or atomic layer deposition (ALD). As the transition metal oxide constituting the photosensitive hard mask 101, a material whose state change occurs when irradiated with EUV light may be used. Examples of the state change include a phase transition (phase change) and a composition change.

Figure 2B:
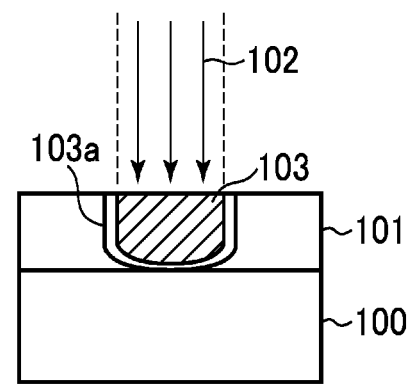

Subsequently, the photosensitive hard mask 101, which is a transition metal oxide film, is exposed to an EUV light 102 in a desired pattern to form an exposed region 103 (step ST2 in FIG. 2B). The exposure at this time is performed via a mask.

Figure 2C:
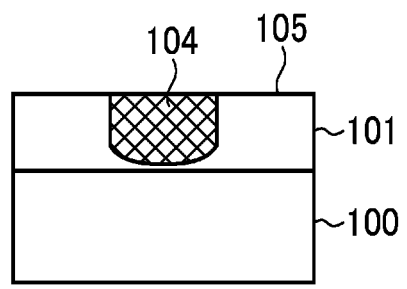

Subsequently, the heat generated by the exposure causes a state change in the exposed region 103, and the exposed region 103 is used as a state change region 104 (step ST3 in FIG. 2C). This state change is made by heating the exposed region 103 with the energy of the EUV light 102 as heat. As a result, an exposure pattern is formed. A heat diffusion region 103a is formed on the outside of the exposed region 103 by heat conduction. However, this region may be kept below the state change temperature so that the state change does not occur.

Figure 2D:
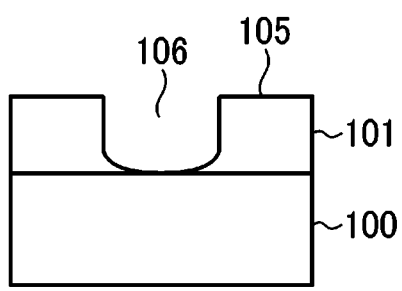

Subsequently, in the photosensitive hard mask 101, either the state change region 104 or a non-state change region 105, which is not exposed and not subjected to state change, is selectively removed (step ST4 in FIG. 2D). In this step, the selective removal is realized by the difference in the removal characteristics between the state change region 104 and the non-state change region 105. As a result, the exposure pattern is developed to form a pattern on the photosensitive hard mask. Although FIG. 2D shows an example of a positive type in which the state change region 104 is removed to form a removal region 106, it may be possible to adopt a negative type in which the non-state change region 105 is removed. The state change region 104 or the non-state change region 105 may be removed by, for example, dry etching or wet etching.

In an exposure process using a conventional chemically amplified resist, when irradiating EUV light, high-energy photons are incident into the resist, and electrons generated by excitation activate a photoacid generator (PAG), thereby allowing the process to proceed. At this time, the number of electrons generated is small and the sensitivity of the photosensitive material is low. Therefore, there are problems that the exposure time is long and the throughput is low. In order to overcome these problems, various proposals have been made to increase the sensitivity of the chemically amplified resist to EUV and shorten the exposure time. For example, there has been widely studied a technique for improving sensitivity such as a technique for increasing the number of electrons generated by excitation by photons by doping a chemically amplified resist with a metal element having a large absorption of EUV light. However, these effects are also limited. There is a demand for a photosensitive material that can fundamentally shorten the exposure time.

Therefore, in the present embodiment, a photosensitive hard mask made of a transition metal oxide film, which is an inorganic material, is used, and a photosensitive process utilizing a state change due to the heat generated when exposed to EUV light as described above is performed instead of the conventional exposure process using a chemical reaction.

EUV light has a wavelength close to X-rays among electromagnetic waves, and EUV light having a wavelength of 13.5 nm (13.5 nm light) used for exposure has a high energy of 91 eV. When the high-energy photons are incident on a film made of an inorganic material, it excites the valence electrons of constituent atoms, and the energy thereof is finally transferred to a crystal lattice to become heat. In the present embodiment, this heat is used to cause a local temperature rise in a transition metal oxide film, which is an inorganic material film, thereby causing a state change of a material.

In the exposure process by a chemical reaction using a chemically amplified resist, only a small portion of the energy of EUV light is used in the chemical reaction, and the remaining energy is dissipated as heat. On the other hand, in the present embodiment, almost all of the energy of EUV light, which has been dissipated as heat in the past, is used to cause a state change, thereby making the energy efficiency essentially high. Therefore, it is possible to shorten the exposure time.

In addition, the unit cell of the inorganic material is smaller than that of a general polymer photosensitive material. In the case of $HfO_2$, the side length of the unit cell is about 0.5 nm. This makes it possible to suppress fluctuations in the pattern width due to the molecular size which is problematic in a chemically amplified resist. Fluctuations in the resulting pattern width may be suppressed. Further, the heat generated at the time of exposure spreads from the exposed region to the outside due to heat diffusion. However, moderate heat diffusion reduces the effect of statistical fluctuation of a pattern width.

Further, both the positive type and the negative type may be selected by either removing the exposed region whose state has been changed or removing the non-exposed region. Thus, the degree of freedom is high.

<Photosensitive Hard Mask>

Next, the photosensitive hard mask will be described in detail.

Figure 3A:
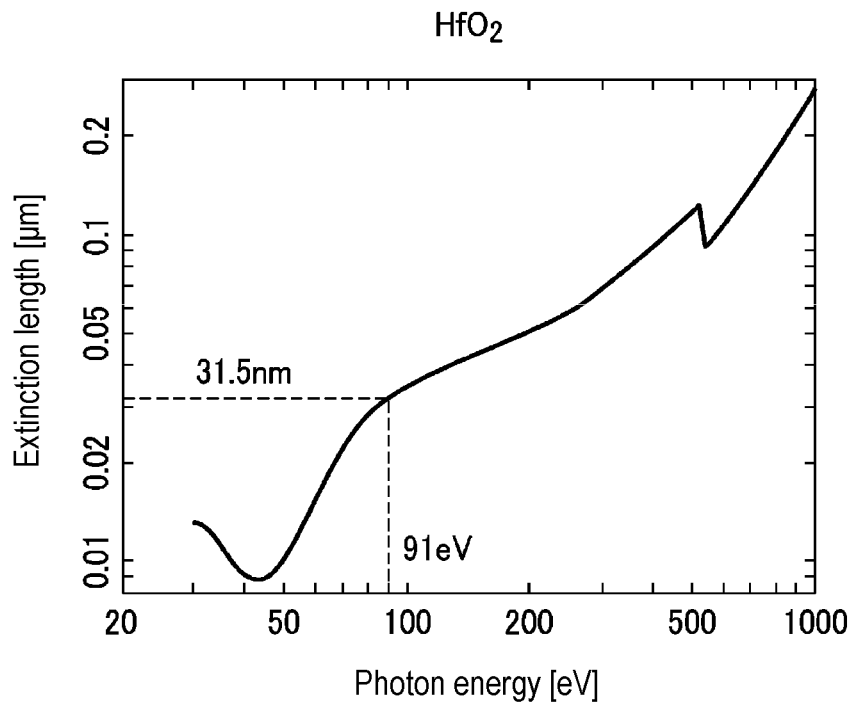
FIGS. 3A and 3B are diagrams showing the relationship between the photon energy of $HfO_2$ and $ZrO_2$ and the extinction length, and the extinction length of 13.5 nm light (91 eV).
Figure 3B:
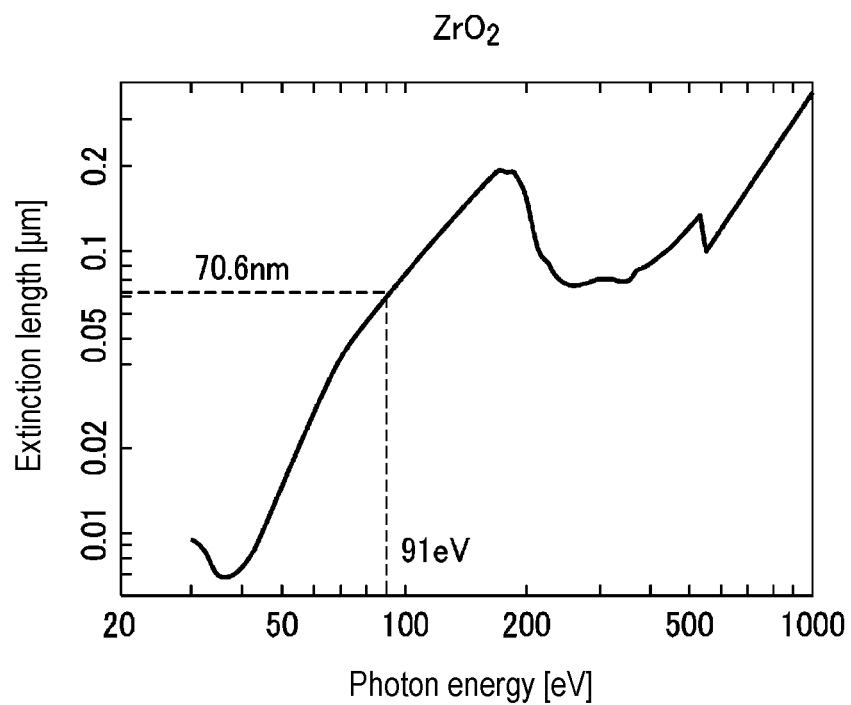

As mentioned above, the photosensitive hard mask is composed of a transition metal oxide. Examples of the transition metal oxide may include tetravalent transition metal oxides such as $HfO_2$ and $ZrO_2$, which are widely used in the semiconductor field, and low-melting-point polyvalent metal oxides such as $WO_x$, $MoO_x$ and $VO_x$. The transition metal oxide has a small extinction length (length at which the light intensity is attenuated to 1/e) for the 13.5 nm light, which is the EUV light used for exposure. As shown in FIGS. 3A and 3B, the extinction lengths of $HfO_2$ and $ZrO_2$ are 31.5 nm and 70.6 nm, respectively. Further, the extinction length of $WO_3$ and $MoO_3$ as $WO_x$ and $MoO_x$ for the 13.5 nm light is as short as 18 nm and 69 nm. That is, the extinction length of the transition metal oxide for the 13.5 nm light is as short as about 18 to 70 nm. The light energy is rapidly attenuated at the short distance, and the energy is converted into heat to cause a state change. On the other hand, the extinction length of a polymer material such as PMMA or the like for the 13.5 nm light is about 0.2 μm, and the energy loss of the lattice occurs with a spatial spread of about several times thereof.

Figure 4:
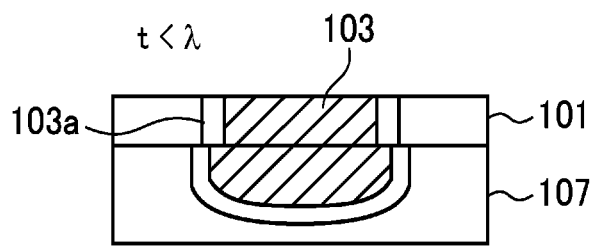
FIG. 4 is a sectional view illustrating a state of an exposed region when the film thickness of a transition metal oxide film constituting the photosensitive hard mask is smaller than the extinction length λ of the EUV light used for exposure.
Figure 5:
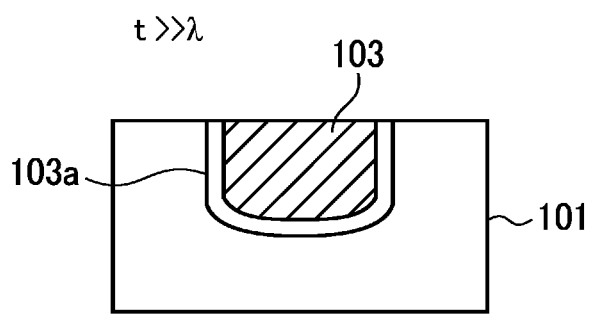
FIG. 5 is a sectional view illustrating a state of an exposed region when the film thickness of a transition metal oxide film constituting the photosensitive hard mask is larger than the extinction length λ of the EUV light used for exposure.

Regarding the film thickness of the transition metal oxide film constituting the photosensitive hard mask, as shown in FIG. 4, if the film thickness t is smaller than the extinction length λ for the EUV light used for exposure, the EUV light may reach a base film 107 existing under the exposed region 103 without being sufficiently attenuated by the transition metal oxide film, and the pattern may be enlarged due to heat diffusion. Further, if the thermal conductivity of the base film 107 is large, due to the film thickness t smaller than the extinction length λ, the heat generated by the exposure to the EUV light may be dissipated to the base film. Thus, the exposed region 103 may not be sufficiently heated, which may make it difficult to sufficiently form a state change region. On the other hand, as shown in FIG. 5, if the film thickness t is excessively larger than the extinction length λ, the EUV light is extinguished in the middle of the photosensitive hard mask 101. Thus, the exposed region 103 may be only partially formed, and the state change region may not be sufficiently formed, resulting in poor development. From the viewpoint of appropriately forming the state change region, the film thickness t of the transition metal oxide film constituting the photosensitive hard mask 101 is preferably a value equal to or larger than the extinction length λ and not excessively larger than λ. The range of λ≤t≤3λ is preferable. It is more preferable that the film thickness t is substantially equal to the extinction length λ.

Among the above transition metal oxides, the tetravalent transition metal oxides such as $HfO_2$ and $ZrO_2$ and the low-melting-point polyvalent oxides such as $WO_x$, $MoO_x$, and $VO_x$ have different characteristics.

In the case of $HfO_2$ and $ZrO_2$, which are tetravalent transition metal oxides, the melting point thereof is as high as about 2700 degrees C. Therefore, $HfO_2$ and $ZrO_2$ may not be melted by the exposure to the EUV light. However, $HfO_2$ and $ZrO_2$ undergo a phase transition at about 1000 degrees C. or lower. Thus, the phase transition is used.

Figure 6A:
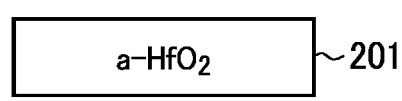
FIGS. 6A to 6D are diagrams for explaining an example of negative patterning when the transition metal oxide film is an $HfO_2$ film.
Figure 6B:
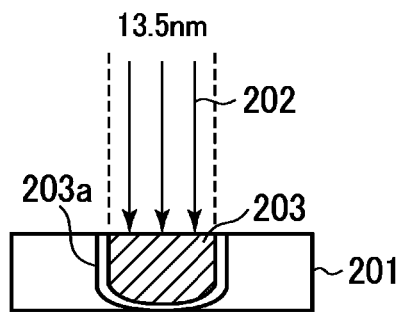
Figure 6C:
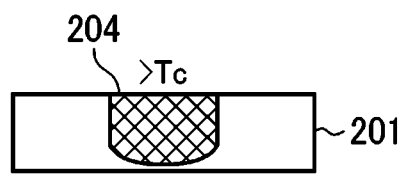
Figure 6D:
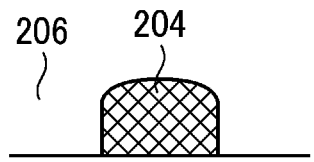

For example, in the case of an $HfO_2$ film, negative patterning may be performed as shown in FIGS. 6A to 6D. First, an $HfO_2$ film (a-$HfO_2$ film) 201, which has an amorphous phase in an as-deposition state, is formed by room temperature sputtering, ALD, or the like (FIG. 6A), and is pattern-exposed to EUV light (13.5 nm light) 202 to form an exposed region 203 (FIG. 6B). Reference numeral 203a designates a heat diffusion region. The exposed region 203 becomes a phase transition region 204 which is heated to a crystallization temperature Tc or higher by the heat generated during the exposure and is subjected to a phase transition (state change) into a crystalline phase, so that an exposure pattern is formed (FIG. 6C). Subsequently, the non-phase transition region having an amorphous phase is selectively removed by wet etching or dry etching to form (develop) a removed region 206, and negative patterning is performed (FIG. 6D). Specifically, in the wet etching by DHF or BHF, the amorphous phase has a higher etching rate than a crystalline phase, and negative patterning that selectively etches the amorphous phase is realized. Selective etching of the amorphous phase may also be realized by dry etching using a HF gas and a $SiCl_4$ gas.

Positive patterning may be performed by selectively etching the crystalline phase in the exposed region.

When $ZrO_2$ is used as the transition metal oxide, it becomes a crystalline phase (low temperature phase) in the as-deposition state. However, since $ZrO_2$ has a high temperature phase, the exposed region is caused to undergo a phase transition to the high temperature phase by setting the heating temperature of the exposed region to be equal to or higher than the phase transition temperature to the high temperature phase. Then, one of them may be selectively removed according to the difference in etching rate between the low temperature phase and the high temperature phase.

In the case of $WO_x$, $MoO_x$ and $VO_x$, which are low-melting-point polyvalent oxides, the melting point thereof is about 800 to 1,500 degrees C., which is lower than the melting point of $HfO_2$ and $ZrO_2$. In particular, the melting point of $MoO_3$ as $MoO_x$ is as extremely low as 795 degrees C. $MoO_3$ may be formed into a film by sputtering. By setting the substrate temperature during sputtering to room temperature, $MoO_3$ has an amorphous phase in an as-deposition state. By setting the substrate temperature to 200 degrees C. or higher, $MoO_3$ has a crystalline phase in an as-deposition state. As a result, negative patterning and positive patterning may be performed.

Figure 7A:
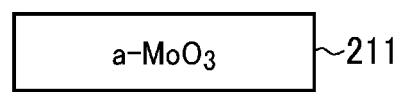
FIGS. 7A to 7D are diagrams for explaining an example of negative patterning when the transition metal oxide is $MoO_3$ ($MoO_x$).
Figure 7B:
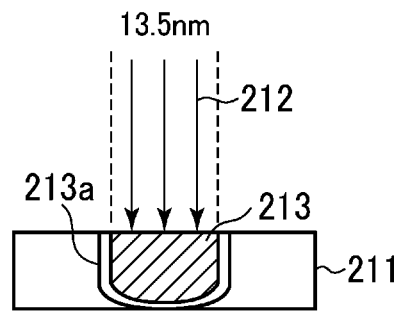
Figure 7C:
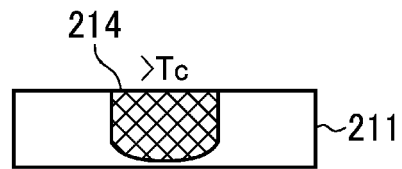
Figure 7D:
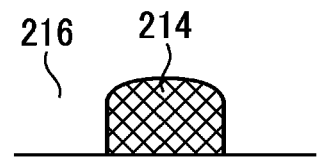

The negative patterning of the $MoO_3$ film may be performed as shown in FIGS. 7A to 7D. First, an $MoO_3$ film (a-$MoO_3$ film) 211, which has an amorphous phase in an as-deposition state, is formed by room temperature sputtering (FIG. 7A), and the $MoO_3$ film is pattern-exposed to EUV light (13.5 nm light) 212 to form an exposed region 213 (FIG. 7B). Reference numeral 213a designates a heat diffusion region. The exposed region 213 becomes a phase transition region 214 which is heated to a crystallization temperature Tc or higher by the heat generated during the exposure and is subjected to a phase transition (state change) into a crystalline phase, so that an exposure pattern is formed (FIG. 7C). Subsequently, the non-phase transition region having an amorphous phase is selectively removed by wet etching or dry etching to form (develop) a removed region 216, and negative patterning is performed (FIG. 7D).

Figure 8A:
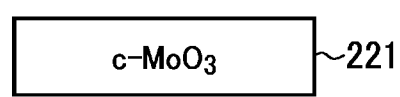
FIGS. 8A to 8D are diagrams for explaining an example of positive patterning when the transition metal oxide is $MoO_3$ ($MoO_x$).
Figure 8B:
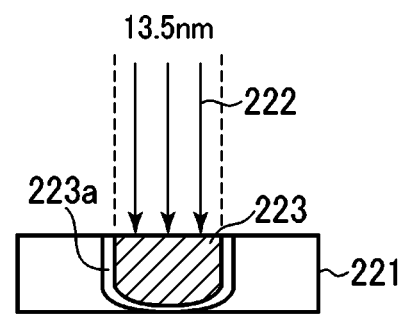
Figure 8C:
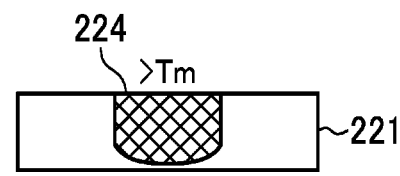
Figure 8D:
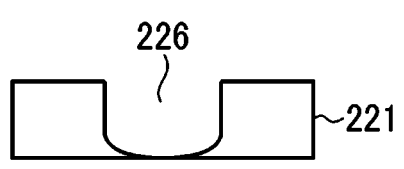

The positive patterning of the $MoO_3$ film may be performed as shown in FIGS. 8A to 8D. First, a $MoO_3$ film (c-$MoO_3$ film) 221 which has a crystalline phase in an as-deposition state is formed by sputtering at 200 degrees C. or higher (FIG. 8A), and is pattern-exposed to EUV light (13.5 nm light) 222 to form an exposed region 223 (FIG. 8B). Reference numeral 223a refers to a heat diffusion region. The exposed region 223 is heated to a melting point Tm or higher and is melted. Then, the exposure is turned off to rapidly cool the exposed region 223 and quench the exposed region 223 in the melted state so that the exposed region 223 becomes a phase transition region 224 having an amorphous phase, whereby an exposure pattern is formed (FIG. 8C). Subsequently, the phase transition region 224, which has an amorphous phase, is selectively removed by wet etching or dry etching to form (develop) a removed region 226, and positive patterning is performed (FIG. 8D).

Figure 9A:
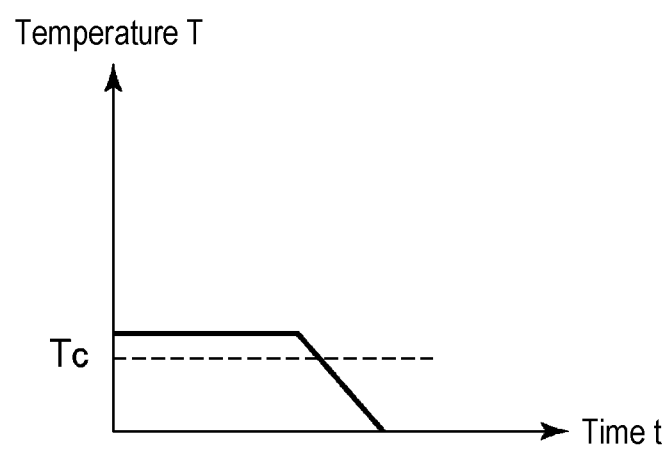
FIGS. 9A and 9B are diagrams schematically showing a state of temperature change and phase transition in the exposed region in the negative patterning and the positive patterning when the transition metal oxide is $MoO_3$ ($MoO_x$).
Figure 9B:
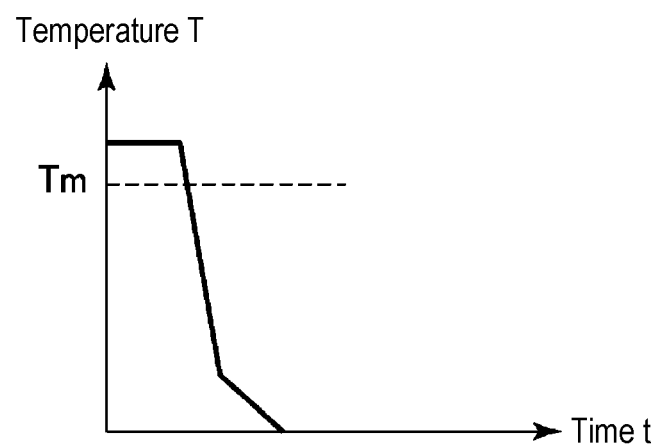

In the case of negative patterning, the $MoO_3$ film having the amorphous phase is exposed to EUV light. As shown in FIG. 9A, the exposed region is heated to a relatively low crystallization temperature Tc or higher, and is gradually cooled. As a result, the exposed region has a crystalline phase. On the other hand, in the case of positive patterning, the $MoO_3$ film having the crystalline phase is exposed to EUV light. As shown in FIG. 9B, the exposed region is heated to a relatively high melting temperature Tm or higher and is melted. The exposed region is rapidly cooled when the exposure is turned off. As a result, the exposed region has an amorphous phase.

Further, if the non-phase transition region has an amorphous phase and the phase transition region has a crystalline phase, positive patterning may be performed by adjusting the etching method and changing the portion to be removed to the phase transition region having a crystalline phase. In the example in which the phase transition region has an amorphous phase and the non-phase transition region has a crystalline phase, negative patterning may be performed by adjusting the etching method and changing the portion to be removed to the non-phase transition region having a crystalline phase.

Although the $MoO_3$ film has been described above by way of example, patterning may be similarly performed for the $WO_3$ film as a $WO_x$ film and the $VO_3$ film as a $VO_x$ film. However, since $WO_3$ and $VO_3$ have a higher melting point than $MoO_3$, it is necessary to lengthen the irradiation time of EUV light at the time of melting.

Further, regarding $WO_x$, $MoO_x$ and $VO_x$, which are low-melting-point polyvalent oxides, the state change at the time of exposure to EUV light is not limited to the phase transition described above, but may be a composition change. $WO_x$, $MoO_x$ and $VO_x$ are oxides whose valences are changeable. Therefore, by using any of $WO_x$, $MoO_x$ and $VO_x$, for example, $MoO_3$ as a photosensitive hard mask and forming, for example, a layer having a reducing action adjacent thereto, $MoO_3$ in the exposed region may be reduced through the reaction with the adjacent layer having a reducing action by the heat generated during the exposure to EUV light, thereby causing a change in composition.

<Advantages of Patterning by EUV Exposure using Photosensitive Hard Mask>

Next, advantages of patterning by EUV exposure using a transition metal oxide film will be described in detail.

The first advantage is that the exposure time may be shortened.

The exposure time when exposing the transition metal oxide film to the EUV light may be easily calculated from the physical properties of a material and the like. The EUV light incident on the transition metal oxide film, which is an inorganic thin film, locally heats a volume determined by the extinction length in the film. $HfO_2$, $ZrO_2$, $WO_3$, and $MoO_3$ used as the transition metal oxide film have a heat capacity of about 1.2 to $2.4 \times 10^6$ $J/m^3 K$. Further, it is known that the heat load on a substrate (wafer) at the time of EUV exposure is about 3 $W/cm^2$ (Laser Focus World, Aug. 29, 2019, "EUV lithography revised"). When patterning is performed using the phase transition caused by heat as described above, the temperature of the exposed region is raised to the temperature required for the phase transition. Since the temperature rise in the exposed region is determined by the power, the dose amount may be small and, therefore, the exposure time may be short. In a simple adiabatic calculation using the above parameters, it is possible to heat the transition metal oxide film to about 1000 degrees C., which is necessary for crystallizing the amorphous phase, in an EUV light exposure time of several milliseconds. The dose amount when the EUV light exposure time is 1 millisecond is 3 $mJ/cm^2$ according to the calculation. This value is $\frac{1}{20}$ or less of 70 $mJ/cm^2$, which is the dose amount during EUV light exposure using a conventional chemically amplified resist. That is, by using the patterning method in which the photosensitive hard mask composed of the transition metal oxide film is exposed to the EUV light to cause a phase transition, the exposure time may be reduced to $\frac{1}{20}$ of the exposure time in the case of using a conventional chemically amplified resist, and the throughput may be greatly improved.

The second advantage is that the pattern edge may be smoothed by thermal diffusion to reduce line edge roughness (LER).

In the transition metal oxide film, which is an inorganic thin film, when the film is locally heated by the exposure to EUV light, the high temperature region expands outside the exposed region due to heat diffusion caused by heat conduction in the film. However, materials such as $HfO_2$ and $ZrO_2$, which are transition metal oxides, have a thermal diffusivity of about $1 \times 10^{-6}$ $m^2/sec$. The temperature of the high temperature region expanded outside the exposed region is lower than the phase transition temperature, and does not affect the pattern shape. On the other hand, heat diffusion occurs sufficiently fast for the formation of nanometer-scale fine patterns. Due to this effect, the temperature of the exposed region and the high temperature region outside the exposed region becomes uniform. As a result, it may be expected to obtain the effect of smoothing the irregular shape (LER) of the pattern edge due to the inhomogeneous structure of the transition metal oxide film when the film is formed.

<Pattern Formation on Film to be etched>

Next, a method of forming a pattern on a film to be processed using the above-described photosensitive hard mask will be described.

Figure 10:
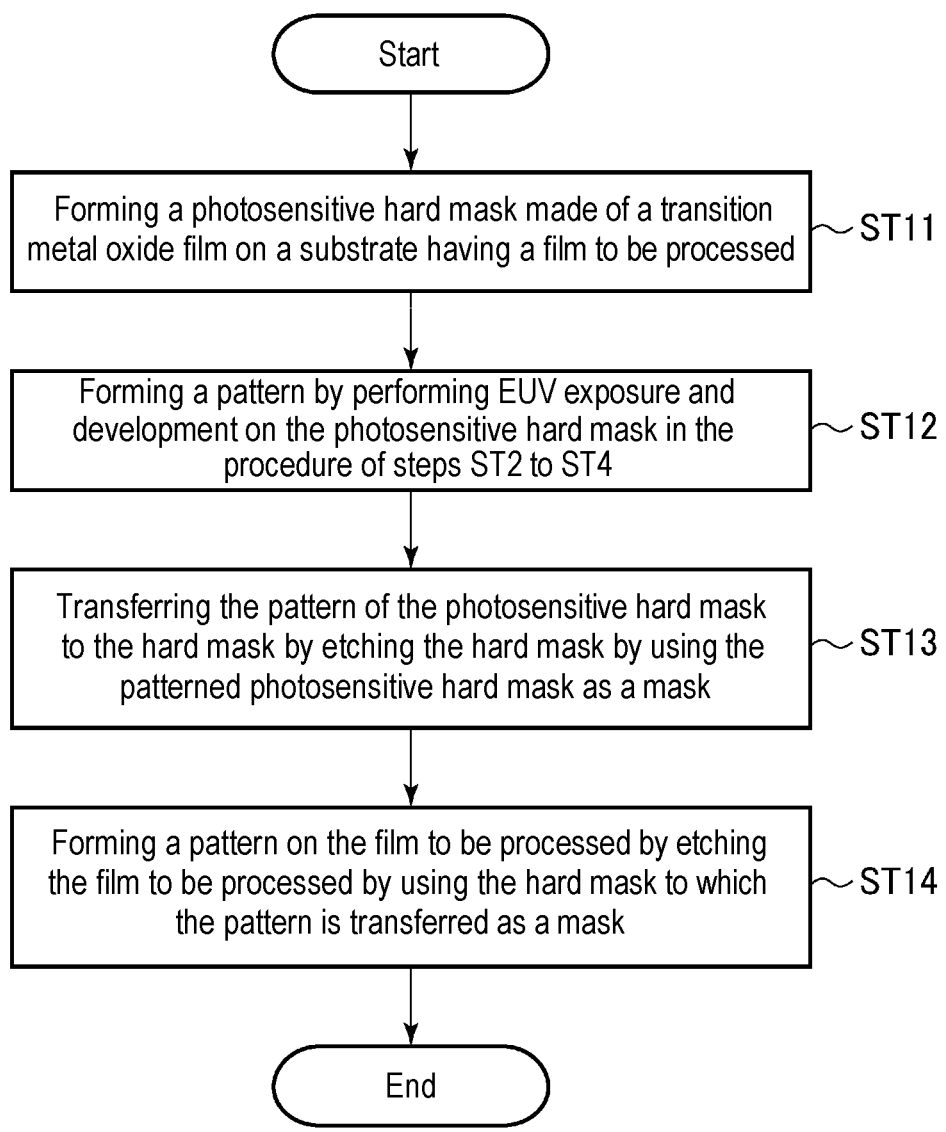
FIG. 10 is a flowchart for explaining a pattern formation method of forming a pattern on a film to be processed by using a photosensitive hard mask.

FIG. 10 is a flowchart for explaining a pattern forming method of forming a pattern on a film to be processed using a photosensitive hard mask, and FIGS. 11A to 11D are process sectional views showing the pattern forming method.

Figure 11A:
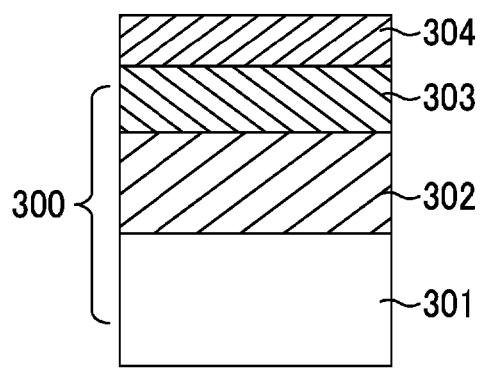
FIGS. 11A to 11D are process sectional views for explaining a pattern formation method of forming a pattern on a film to be processed by using a photosensitive hard mask.
Figure 11B:
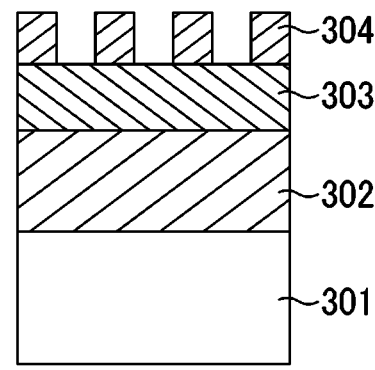

First, a photosensitive hard mask 304 made of a transition metal oxide film is formed on a substrate 300 having a film to be processed (step ST11 in FIG. 11A). Examples of the substrate 300 include a semiconductor substrate (Si substrate) 301 on which a film 302 to be processed is formed and a hard mask 303 formed on the film 302. As the film 302 to be processed, an insulating film or a metal film may be used. As the hard mask 303, a material that can secure an etching selectivity with respect to the film 302 to be processed is selected. For example, $SiO_2$, SiN, TiN, amorphous carbon, or the like is used. Depending on the etching selection ratio, a plurality of hard masks may be used to secure a processing margin.

Subsequently, EUV exposure and development are performed on the photosensitive hard mask 304 in the procedure of steps ST2 to ST4 described above to form a pattern (step ST12 in FIG. 11B).

Figure 11C:
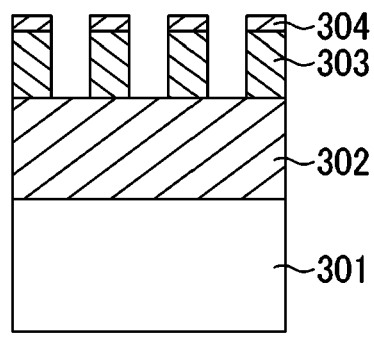

Subsequently, the hard mask 303 is etched by using the patterned photosensitive hard mask 304 as a mask to transfer the pattern of the photosensitive hard mask 304 to the hard mask 303 (step ST13 in FIG. 11C).

Figure 11D:
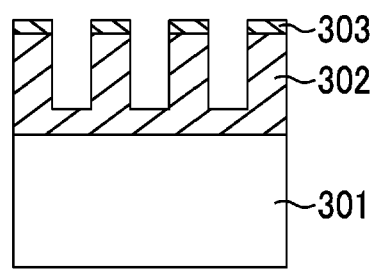
Figure 12A:
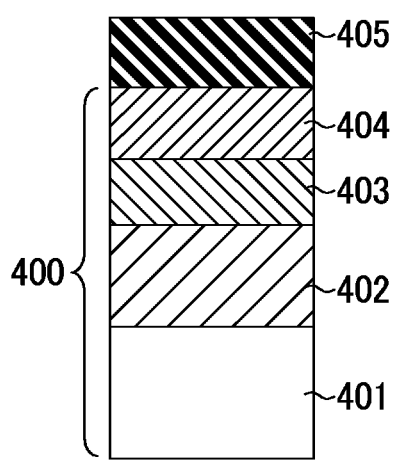
FIGS. 12A to 12E are process sectional views for explaining a case where a pattern is formed on a film to be processed by using a conventional chemically amplified resist.
Figure 12B:
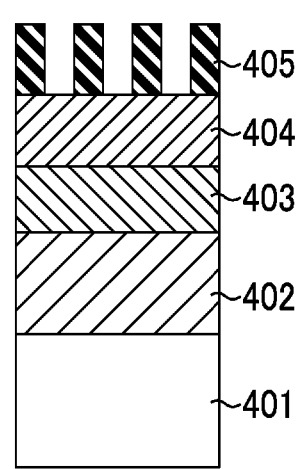
Figure 12C:
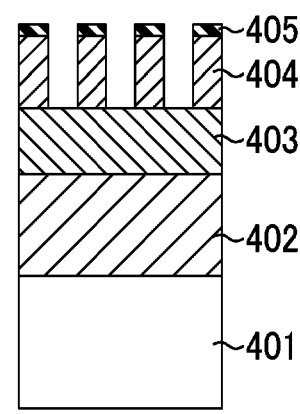
Figure 12D:
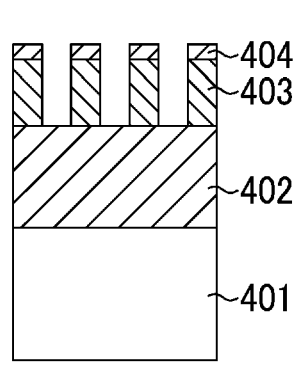
Figure 12E:
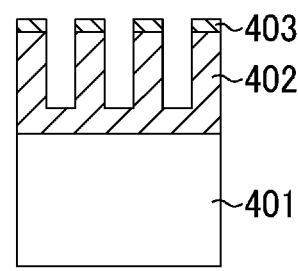

Subsequently, the film 302 to be processed is etched by using the hard mask 303 to which the pattern is transferred is used as a mask, to form a pattern on the film 302 to be processed (step ST14 in FIG. 11D).

By using the photosensitive hard mask made of the transition metal oxide film for patterning the film to be processed in this way, it is possible to obtain not only the above-mentioned effects such as shortening the exposure time when forming the exposure pattern but also an effect of reducing the number of masks when patterning the film to be processed.

In the case of an organic material such as a conventional chemically amplified resist or the like, the etching resistance is low when the film to be processed is patterned by etching. Therefore, for example, as shown in FIGS. 12A to 12E, it is required that a substrate 400 on which a film 402 to be processed, a hard mask 403 and an amorphous carbon film 404 are formed is used to form a chemically amplified resist film 405 thereon and perform patterning for the resist film 405. That is, it is required that a pattern is formed on the chemically amplified resist film 405 by EUV exposure and development, the pattern is transferred to the amorphous carbon film 404, the transferred pattern is further transferred to the hard mask 403, and then the film 402 to be processed is patterned.

On the other hand, the photosensitive hard mask made of a transition metal oxide film has higher etching resistance than an organic material such as a conventional chemically amplified resist. Therefore, as described above, the pattern of the photosensitive hard mask may be directly transferred to the hard mask, and the film to be processed may be patterned by the transfer pattern of the hard mask.

<Other Applications>

Although the embodiments have been described above, the embodiments disclosed herein should be considered to be exemplary and not limitative in all respects. The above embodiments may be omitted, replaced, or modified in various forms without departing from the scope of the appended claims and their gist.

For example, in the above-described embodiments, there has been described the example in which $HfO_2$, $ZrO_2$, $WO_x$, $MoO_x$, or $VO_x$ is used as the transition metal oxide constituting the photosensitive hard mask. However, the present disclosure is not limited thereto, and other transition metal oxides may be used.

According to the present disclosure, it is possible to provide a pattern formation method capable of forming a pattern in a short time when performing EUV exposure, and a photosensitive hard mask.

What is claimed is:

1. A pattern formation method, comprising:
    forming a photosensitive hard mask made of a transition metal oxide film on a surface of a substrate;
    exposing the photosensitive hard mask to EUV light in a desired pattern;
    causing a state change in an exposed region by heat generated during exposure; and
    selectively removing either a region where the state change has occurred or a region where the state change has not occurred,
    wherein a thickness t of the transition metal oxide film constituting the photosensitive hard mask is in a range of $\lambda \leq t \leq 3\lambda$, where $\lambda$ is an extinction length of the EUV light used for the exposure.

2. The pattern formation method of claim 1, wherein the state change is a phase transition or a composition change.

3. The pattern formation method of claim 2, wherein a transition metal oxide constituting the transition metal oxide film is a tetravalent transition metal oxide.

4. The pattern formation method of claim 3, wherein the tetravalent transition metal oxide is $HfO_2$ or $ZrO_2$.

5. The pattern formation method of claim 4, wherein the transition metal oxide film is an amorphous phase $HfO_2$ film, and the exposed region is configured to undergo a phase transition to a crystalline phase by being heated to a crystallization temperature or higher.

6. The pattern formation method of claim 2, wherein a transition metal oxide constituting the transition metal oxide film is a low-melting-point polyvalent oxide.

7. The pattern formation method of claim 6, wherein the low-melting-point polyvalent oxide is $WO_x$, $MoO_x$, and $VO_x$.

8. The pattern formation method of claim 7, wherein the transition metal oxide film is an amorphous phase $MoO_x$ film or a crystalline phase $MoO_x$ film, the exposed region is heated to a crystallization temperature or higher to undergo a phase transition to a crystalline phase when the amorphous phase $MoO_x$ film is used, and the exposed region is heated to a temperature higher than a melting point thereof and rapidly cooled to undergo the phase transition to an amorphous phase when the crystalline phase $MoO_x$ film is used.

9. The pattern formation method of claim 1, wherein the selectively removing is performed by a dry etching or a wet etching.

10. A pattern formation method, comprising:
    forming a photosensitive hard mask made of a transition metal oxide film on a surface of a substrate on which a film to be processed and a hard mask are formed;
    exposing the photosensitive hard mask to EUV light in a desired pattern;
    causing a state change in an exposed region by heat generated during exposure;
    forming a pattern on the photosensitive hard mask by selectively removing either a region where the state change has occurred or a region where the state change has not occurred;
    transferring the pattern of the photosensitive hard mask to the hard mask; and
    forming a pattern on the film to be processed by etching the film to be processed by using the hard mask to which the pattern is transferred as a mask,
    wherein a thickness t of the transition metal oxide film constituting the photosensitive hard mask is in a range of $\lambda \leq t \leq 3\lambda$, where $\lambda$ is an extinction length of the EUV light used for the exposure.

11. A photosensitive hard mask exposed and developed by EUV light in a desired pattern to form a pattern,
    wherein the photosensitive hard mask is made of a transition metal oxide film, and is configured so that when exposed to the EUV light, a state change occurs in an exposed region due to heat generated during exposure, the photosensitive hard mask having the pattern formed by selectively removing either a region where the state change has occurred or a region where the state change has not occurred, and
    wherein a thickness t of the transition metal oxide film constituting the photosensitive hard mask is in a range of $\lambda \leq t \leq 3\lambda$, where $\lambda$ is an extinction length of the EUV light used for the exposure.

12. The photosensitive hard mask of claim 11, wherein the state change is a phase transition or a composition change.

13. The photosensitive hard mask of claim 12, wherein a transition metal oxide constituting the transition metal oxide film is a tetravalent transition metal oxide.

14. The photosensitive hard mask of claim 13, wherein the tetravalent transition metal oxide is $HfO_2$ or $ZrO_2$.

15. The photosensitive hard mask of claim 14, wherein the transition metal oxide film is an amorphous phase $HfO_2$ film, and the exposed region is configured to undergo a phase transition to a crystalline phase by being heated to a crystallization temperature or higher.

16. The photosensitive hard mask of claim 12, wherein a transition metal oxide constituting the transition metal oxide film is a low-melting-point polyvalent oxide.

17. The photosensitive hard mask of claim 16, wherein the low-melting-point polyvalent oxide is $WO_x$, $MoO_x$, and $VO_x$.

18. The photosensitive hard mask of claim 17, wherein the transition metal oxide film is an amorphous phase $MoO_x$ film or a crystalline phase $MoO_x$ film, the exposed region is heated to a crystallization temperature or higher to undergo a phase transition to a crystalline phase when the amorphous phase $MoO_x$ film is used, and the exposed region is heated to a temperature higher than a melting point thereof and rapidly cooled to undergo the phase transition to an amorphous phase when the crystalline phase $MoO_x$ film is used.

* * * * *